(12) United States Patent
Rosselli et al.

(10) Patent No.: US 9,529,028 B2
(45) Date of Patent: *Dec. 27, 2016

(54) GROUND POTENTIAL RISE SENSORS

(71) Applicant: SAN DIEGO GAS & ELECTRIC COMPANY, San Diego, CA (US)

(72) Inventors: Girolamo Rosselli, Lakeside, CA (US); Phil A. Patton, San Diego, CA (US); William J. Cook, San Diego, CA (US)

(73) Assignee: SAN DIEGO GAS & ELECTRIC COMPANY, San Diego, CA (US)

( * ) Notice: Subject to any disclaimer, the term of this patent is extended or adjusted under 35 U.S.C. 154(b) by 580 days.

This patent is subject to a terminal disclaimer.

(21) Appl. No.: 13/870,929

(22) Filed: Apr. 25, 2013

(65) Prior Publication Data

US 2014/0266249 A1 Sep. 18, 2014

Related U.S. Application Data

(63) Continuation-in-part of application No. 13/801,347, filed on Mar. 13, 2013, now Pat. No. 9,444,245.

(51) Int. Cl.
*G01R 27/14* (2006.01)
*G01R 27/20* (2006.01)
*H02H 3/40* (2006.01)
*G01R 27/18* (2006.01)
*H02H 7/26* (2006.01)

(52) U.S. Cl.
CPC ............. *G01R 27/18* (2013.01); *H02H 7/26* (2013.01); *G01R 27/14* (2013.01); *G01R 27/20* (2013.01); *H02H 3/40* (2013.01)

(58) Field of Classification Search
CPC combination set(s) only.
See application file for complete search history.

(56) References Cited

U.S. PATENT DOCUMENTS

| 8,223,031 B1* | 7/2012 | Allen et al. .................. 340/662 |
| 2010/0026425 A1* | 2/2010 | Roscoe et al. .................... 335/7 |
| 2012/0147511 A1* | 6/2012 | Kim ............................. 361/111 |
| 2013/0308229 A1 | 11/2013 | Faxvog et al. |
| 2015/0022216 A1* | 1/2015 | Rosselli et al. ............... 324/509 |

FOREIGN PATENT DOCUMENTS

JP 10-078463 * 3/1998 ............. G01R 27/20

OTHER PUBLICATIONS

Computer_generated translation of JP 10-078463, published on Mar. 1998.*

* cited by examiner

*Primary Examiner* — Huan Tran
(74) *Attorney, Agent, or Firm* — Sheppard, Mullin, Richter & Hampton LLP

(57) ABSTRACT

Ground Potential Rise (GPR) sensors measure the GPR between the ground grid and the remote earth. A GPR sensor may provide a GPR measurement to an existing distance protection, which may operate based on this measurement automatically. A GPR sensor may comprise a potential transformer configured such that one wire of the high voltage side of the potential transformer is coupled to the ground grid of a substation. The second wire of the potential transformer is coupled to an insulated wire which is coupled to a ground rod or multiple of ground rods bonded together, that is driven into the earth. The low voltage side of the potential transformer is used to connect Distance Relays, Voltage Relays, DFR or Alarms.

14 Claims, 10 Drawing Sheets

GROUND POTENTIAL RISE SENSORS

CROSS-REFERENCE TO RELATED APPLICATIONS

This application is a continuation-in-part of and claims the benefit of U.S. application(s) Ser. No. 13/801,347, filed Mar. 13, 2013, which is hereby incorporated herein by reference in the entirety.

TECHNICAL FIELD

The present invention relates generally to protection of electrical power systems, and more particularly, some embodiments relate to ground potential rise sensors for applications in high voltage electrical substations.

DESCRIPTION OF THE RELATED ART

An electrical power system usually comprises protection systems configured to protect, monitor, and control various electrical power equipment and devices. In the event of a fault or short circuit, these protection systems may isolate the faulted area from the rest of the electrical power systems and prevent the fault from affecting a portion or the entire electrical power system, thereby ensuring reliable and stable operations of the electrical power system.

FIG. 1 (prior art) illustrates operations of a prior art distance relay. The illustrated power system 100 comprises buses 101 and 111, voltage sources 102 and 112, relays 103 and 113, potential transformers 104 and 114, current transformers 105 and 115, and circuit breakers 106 and 116. The relays 103 and 113, potential transformers 104 and 114, current transformers 105 and 115, as well as circuit breakers 106 and 116 compose the protection system for the power system 100. In particular, the protection system protects the transmission line 107 and the voltage sources 102 and 112.

Single-line-to-ground faults occur more frequently than other types of faults and ground distance protection relays are commonly used for the protection of such faults. Distance protection relays operate by determining an apparent impedance of the transmission line through the measurements of the bus voltage and the line current during a fault. As illustrated, the relays 103 and 113 are distance relays that require a current transformer (CT) and a potential transformer (PT) as primary sensing inputs. PT 104 measures voltage of the bus 101 and PT 114 measures voltage of the bus 111. The measured voltages are with reference to the substation ground which is the ground grid of the substation. CT 105 and CT 115 measure the current flowing through the transmission line 107.

An apparent impedance (Za) of the transmission line 107 is calculated by using measurements provided by the CTs 105 and 115 and the PTs 104 and 114. Upon determining Za is equal to or less than a predetermined impedance value, the relays 103 and 113 may trip open the circuit breakers 106 and 116 by sending them a signal, respectively. Zone 1 of the ground distance relay is usually set as a percentage (for example, 80-90%) of the line impedance.

The relays 103 and 113 calculate the apparent impedance Za according to Equation (1):

$$Z_a = \frac{V_{LG}}{I_{ph} + K3I_0} \quad (1)$$

where Za is the apparent impedance as seen by the relay; $V_{LG}$ is the Line-to-Ground voltage for each of the three phases; $I_{ph}$ is the phase current for the fault involved; K is the line compensation factor (i.e., $$\frac{(Z_0 - Z_1)}{3Z_1}$$

where $Z_0$ is the zero sequence impedance of the line and $Z_1$ is the positive sequence impedance of the line); and $3I_0$ is the residual current flowing in the transmission line where the fault occurs.

BRIEF SUMMARY OF THE INVENTION

According to various embodiments of the invention, systems and methods for adaptive distance protection is provided. The adaptive distance protection system and method measure the potential of a system ground in reference to the remote earth to take into account of the ground resistance in calculating the apparent impedance of a transmission line. Conventional protection systems usually disregard the effect of the ground resistance between the ground grid and true remote earth. Voltage measures that are in reference to the ground grid are assumed to be in reference to the true remote earth. Even though the ground resistance is generally small, ignoring the effect of the ground resistance may result in an improper calculation of the apparent impedance and misoperation of the transmission line.

GPR sensors measure the GPR between the ground grid and the remote earth. A GPR sensor may provide a GPR measurement to an existing distance protection, which may operate based on this measurement automatically. For example, distance relays or voltage relays that use voltage as one of the operating quantity may use the measurement provided by the GPR sensor. Accordingly, accuracy of the relays and the tripping logic are improved, and potential mis-operations of the relays are reduced or eliminated. The fault location logic may also be improved as a result.

In various embodiments, the adaptive distance protection system may comprise a potential transformer measuring the ground potential rise (GPR) between the ground grid and the true remote earth. An accurate assessment of the apparent impedance of a transmission line is therefore provided and reduces the risk of misoperation. Various embodiments may calculate the apparent impedance of a transmission line based on the line current, the line voltage, and the GPR measured.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

The figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF THE INVENTION

The present invention is directed toward a system and method for providing an adaptive distance protection. Various embodiments may be installed in a power system to provide an accurate measurement of the apparent impedance of the transmission lines thereby ensuring reliable and stable operations of the power system. Some embodiments may augment existing protection systems installed in a power system, for example, via a retrofitting process, to enhance reliability of the power system, reduce costs and expand opportunities for deployment.

Conventional ground distance relays are prone to misoperate in the event of a fault as a result of assuming voltage measurements that are in reference to the ground grid are in reference to the true remote earth, since the phase voltage and the line current measured at the bus are used to determine the apparent impedance of a transmission line. When calculating impedance of the transmission in the event of a fault, the voltage is assumed to be with reference to true ground, i.e. no ground resistance exists between the grid ground and the remote earth. However, the relays at the substation measure the voltage with respect to the ground grid of the substation and not to the true ground. This may result in inaccurate measurements of phase voltages at the bus because the ground resistance between the ground grid and true remote earth is not always negligible.

Figure 1:
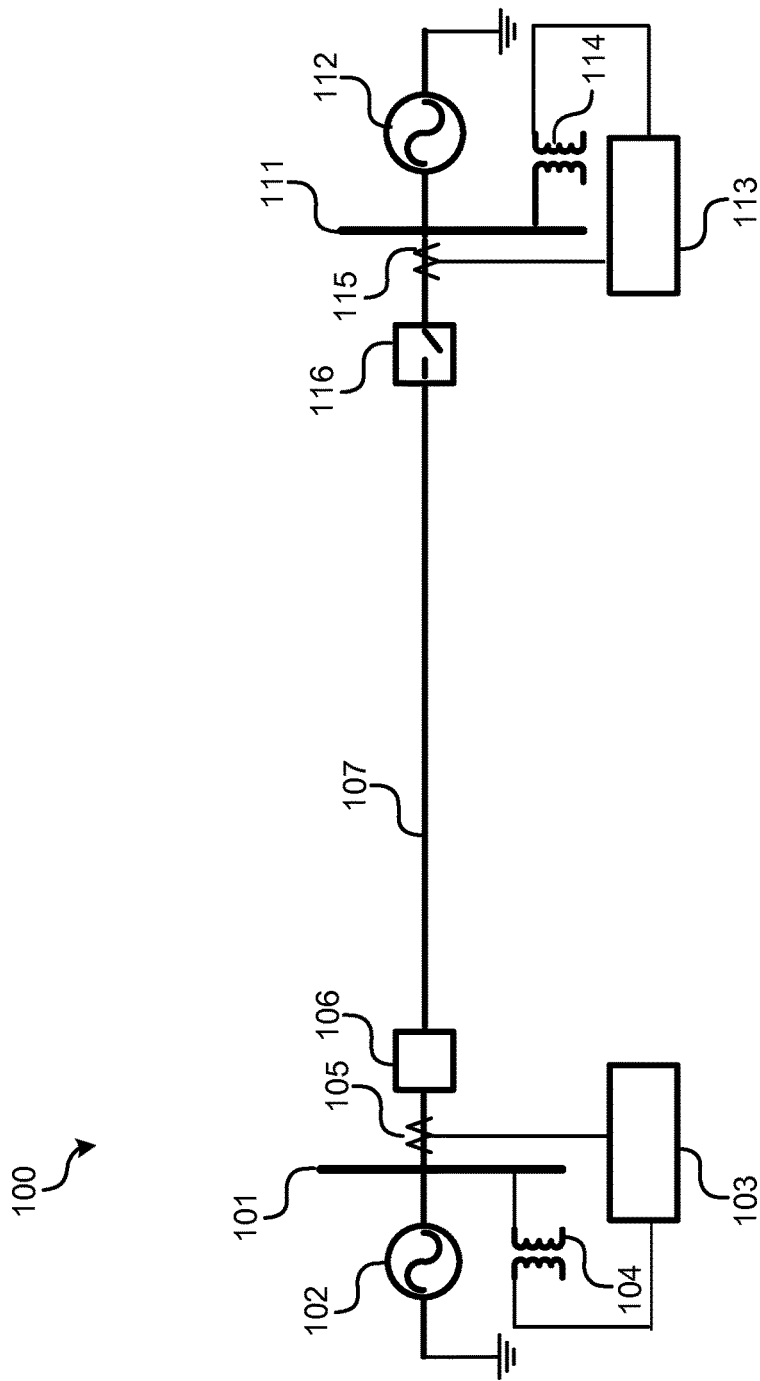
FIG. 1 illustrates operations of a prior art distance relay.

As illustrated in FIG. 1, the calculation of the apparent impedance of the transmission line 107 may be based on the voltage measurements provided by the potential transformers 104 and 114. Misoperation of the transmission line 107 may occur as the calculated apparent impedance Za does not reflect the actual operation (i.e., the actual impedance) of the transmission line. For example, a $V_{LG}$ of 20 V may be measured as 15 V during a fault event, which results in a calculation of Za at 7.5Ω even though the actual line impedance is 10Ω. As a result, line 107 may be tripped open mistakenly.

The adaptive distance protection system and method measure the potential of a system ground in reference to the remote earth to take into account of the ground resistance in calculating the apparent impedance of a transmission line. In various embodiments, the adaptive distance protection system may comprise a potential transformer measuring the ground potential rise (GPR) between the ground grid and the true remote earth. An accurate assessment of the apparent impedance of a transmission line is therefore provided and reduces the risk of misoperation. Various embodiments may calculate the apparent impedance of a transmission line based on the line current, the line voltage, and the GPR measured. Consequently, the fault location may also be determined correctly.

Figure 2A:
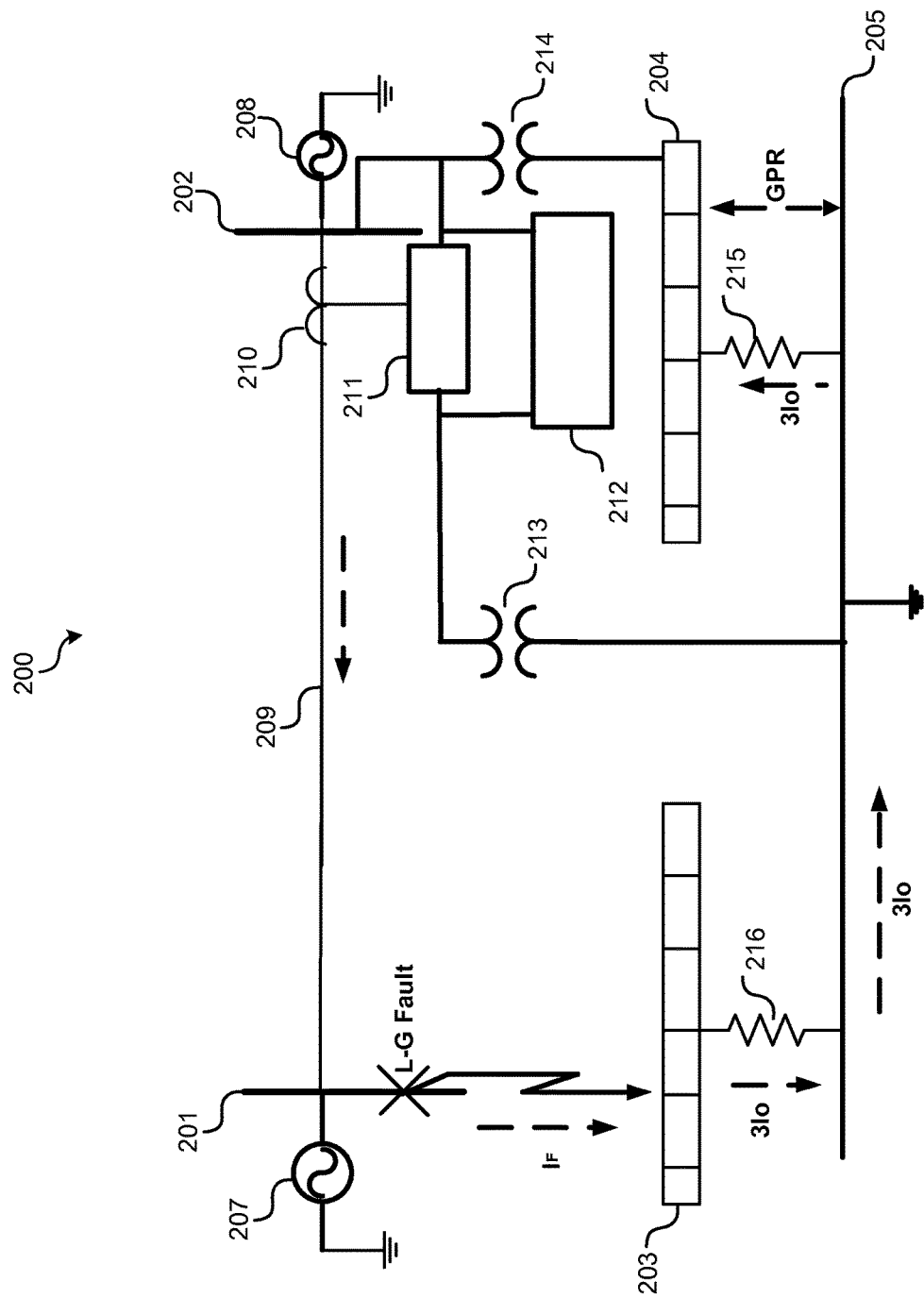
FIG. 2A illustrates an exemplary adaptive distance protection system installed in a power system in accordance with an embodiment.
Figure 2B:
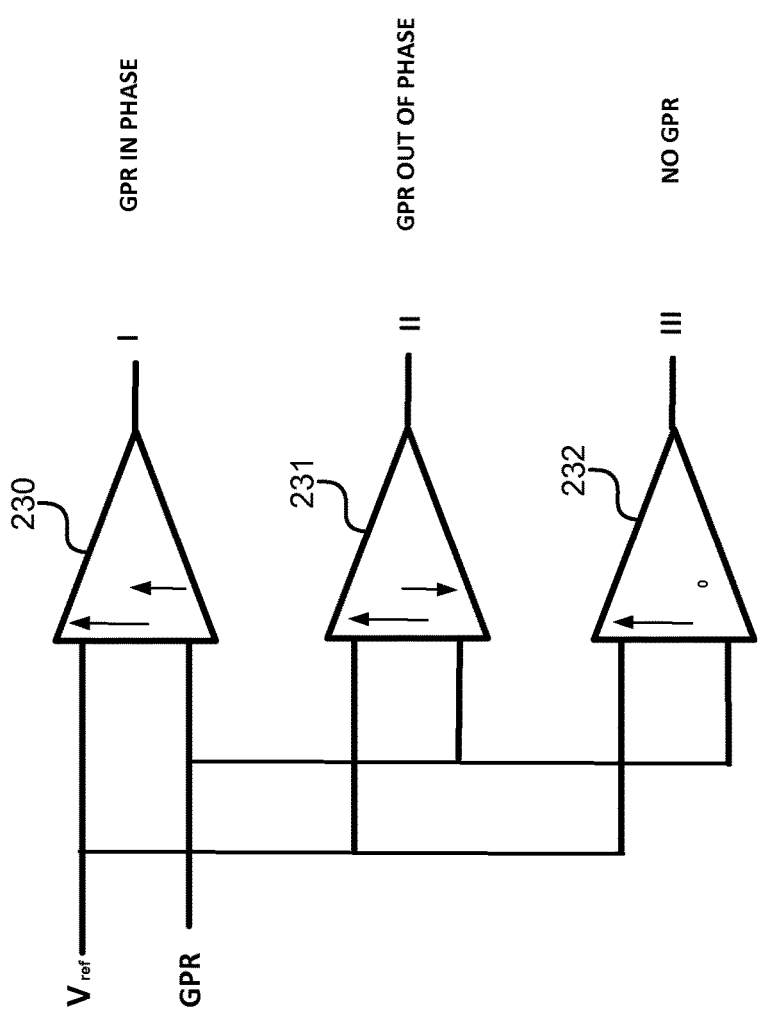
FIG. 2B illustrates a block diagram illustrating operation of an adaptive distance protection system in accordance with an embodiment.

FIG. 2A and FIG. 2B illustrate operation of an adaptive distance protection system in accordance with an embodiment. FIG. 2A illustrates an exemplary adaptive distance protection system installed in a power system 200 in accordance with an embodiment. The electrical power system 200 comprises buses 201 and 202 connected by a transmission line 209, voltage sources 207-208, a current transformer 210, potential transformers 213-214, and relays 211-212. The current transformer 210, relays 211-212, and phase transformers 213-214 compose the protection system of the power system 200. The resistors 215 and 216 illustrate the ground grid resistance between the ground grid 203-204 of the power system 200 and the true remote earth 205.

The relay 211 may comprise a directional element that determines the direction of a fault. One or more current and/or voltage signals by CTs and PTs including CT 210 and PTs 213-214 may be provided to the directional element for determining the direction of a fault.

Existing relays may be augmented to reduce the risk of misoperation and to enhance reliability via retrofitting. In one embodiment, the relay 212 may be an existing relay of the power system 200, and the relay 211 and the PT 213 are deployed. As illustrated, the existing relay 212 may be coupled to the relay 211. As such, GPR is included in the operation of the existing relay 212.

CT 210 measures the current of the transmission line 209, PT 214 and PT 213 measure the voltage of the bus 202. These measurements may be provided to the relays 211-212. In the event of a line-to-ground fault on bus 201, the apparent impedance is calculated according to Equation (2):

$$Z_a = \frac{V_{LG} \pm I_{gg} * R_{gg}}{I_{ph} + K3I_0} \quad (2)$$

where Za is the apparent impedance as seen by the relay; $I_{gg}$ is the ground current returning to the ground grid; $R_{gg}$ is the ground grid resistance, $V_{LG}$ is the Line-to-ground voltage for each of the three phases $I_{ph}$ is the phase current for the fault involved; K is the line compensation factor equal to (Z0-Z1)/3Z1, where $Z_0$ is the zero sequence impedance of the line and $Z_1$ is the positive sequence impedance of the line; and $3I_0$ is the residual current flowing in the faulted line.

Ground Potential Rise (GPR) is included into the calculation of the apparent impedance. Voltage measured by the PT 214 is used as a reference voltage. When the GPR is positive, the fault current flows from the grid grounds 203 and 204 to the remote earth ground 205. When the GPR is negative, the fault current flows from the remote earth ground 205 to the grid grounds 203 and 204. The GPR is compared to the voltage measured by the PT 214, in particular, the phase of the GPR is compared to the phase of the voltage measured by the PT 214, to determine a voltage ($V_{LG} \pm I_{gg}*R_{gg}$) for calculating the apparent impedance Za.

In addition, fault location may be determined according to Equation (3):

$$nXa = n(\text{Im})Za = n(\text{Im})\frac{V_{LG} \pm I_{gg}*R_{gg}}{I_{ph} + K3I_0} \qquad (3)$$

where Xa is the apparent reactance, which is the imaginery part of the apparent impedance Za, n is the per unit distance to the fault (i.e., the distance to the fault divided by the total length of the transmission line).

FIG. 2B illustrates a block diagram illustrating operation of an adaptive distance protection system in accordance with an embodiment. Various embodiments may compare the phase of the GPR to the phase of the reference voltage to determine the proper voltage for calculating the apparent impedance Za. The reference voltage and GPR are provided to the comparators 230-232. When the comparator 230 determines that GPR is in phase with the reference voltage, GPR is subtracted from the reference voltage resulting in an output voltage $V_{LG}-I_{gg}*R_{gg}$ used for calculating the apparent impedance Za. When the comparator 231 determines that GPR is out of phase with the reference voltage, GPR is added to the reference voltage resulting in an output voltage $V_{LG}+I_{gg}*R_{gg}$ used for calculating the apparent impedance Za. When the comparator 232 determines that there is no GPR (i.e., GPR is zero), the output voltage is the reference voltage $V_{LG}$ for calculating the apparent impedance Za.

Figure 2C:
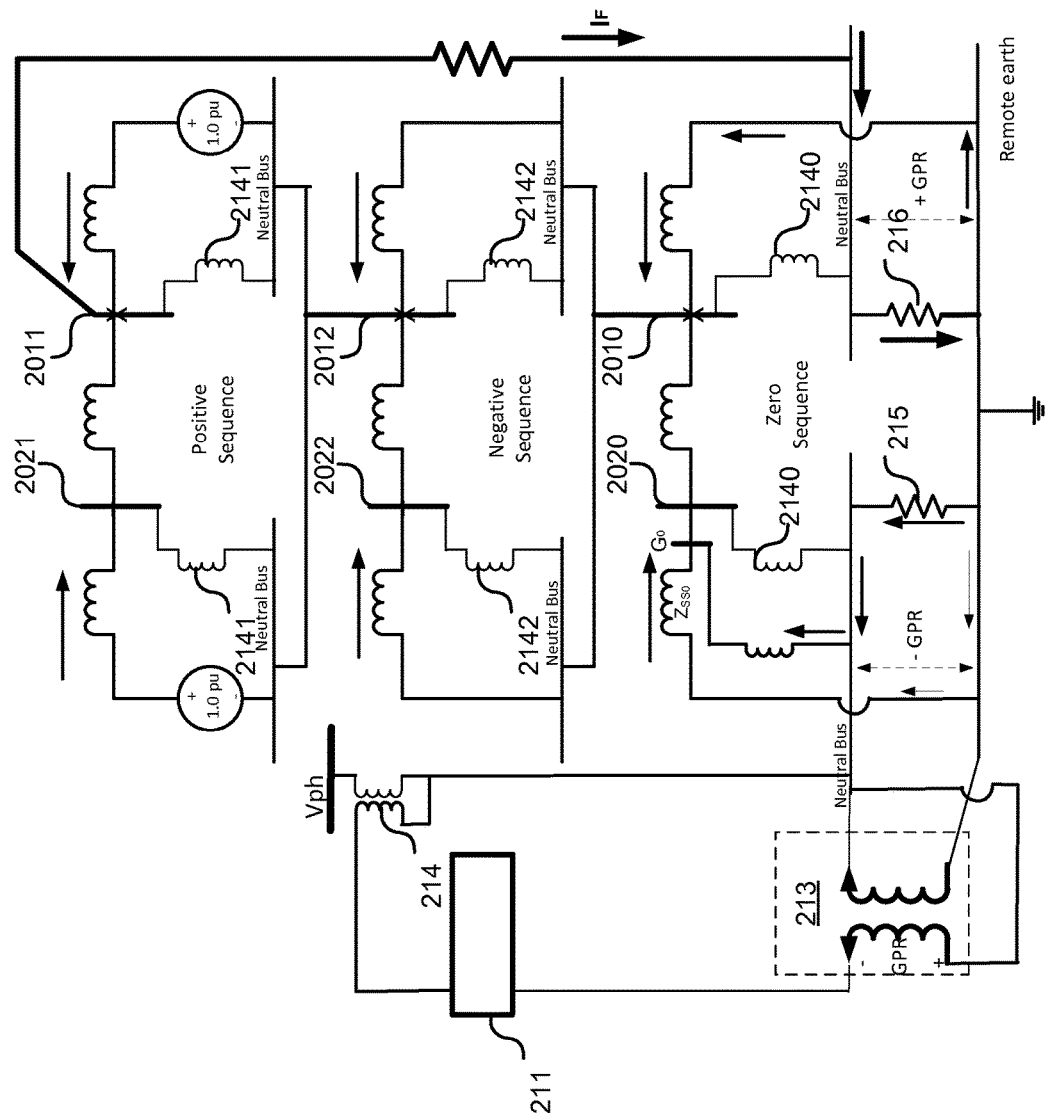
FIG. 2C illustrates a sequence diagram for conducting the symmetrical component analysis of the system 200 installed with an exemplary adaptive distance protection system.

FIG. 2C illustrates a sequence diagram for conducting the symmetrical component analysis of the system 200 installed with an exemplary adaptive distance protection system. As illustrated, the zero sequence of the power system 200 is coupled to the remote earth. Voltage of the neutral bus may be calculated accurately to reflect the GPR, which may be measured by the PT 213.

Figure 3A:
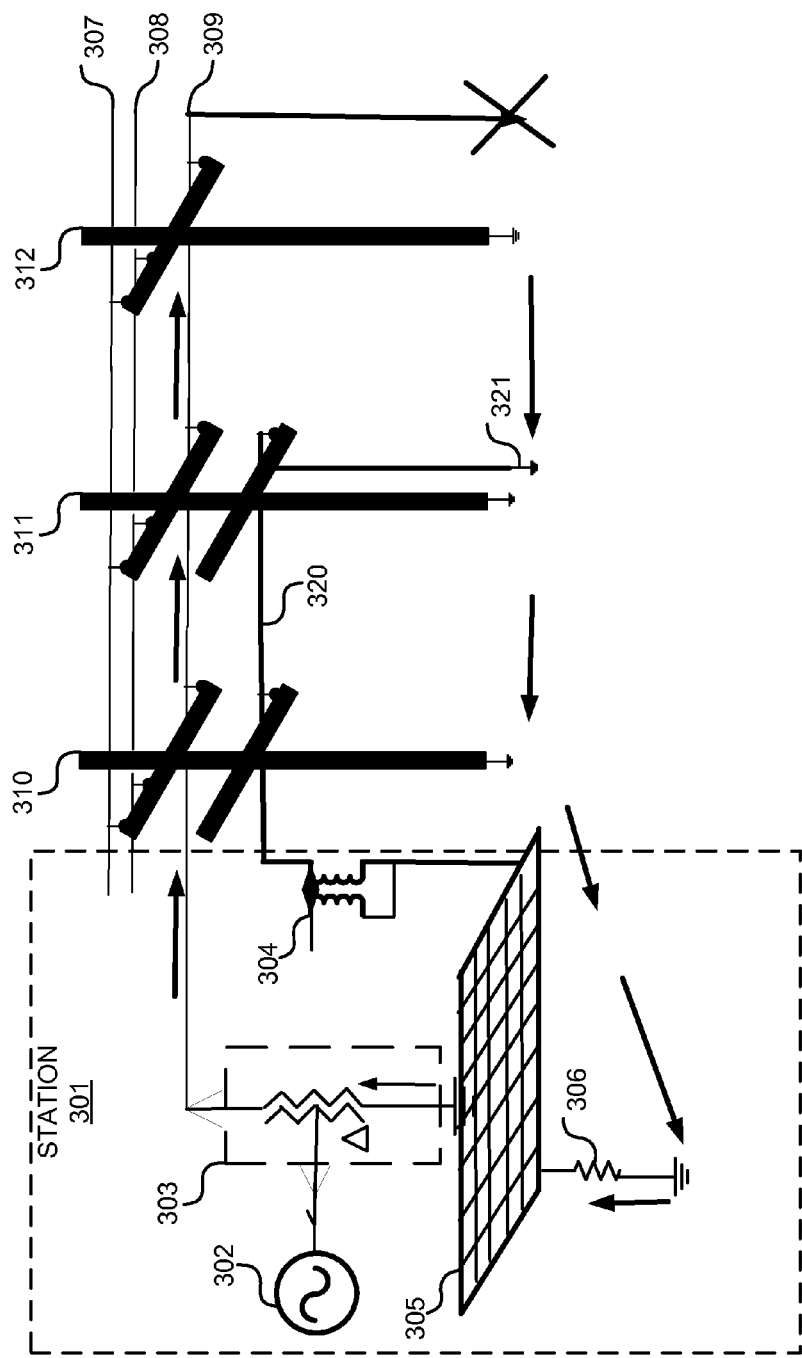
FIG. 3A illustrates an installation of an exemplary adaptive distance protection system in accordance with an embodiment.

FIG. 3A illustrates an installation of an exemplary adaptive distance protection system in accordance with an embodiment. As illustrated, transmission lines 307-309 are coupled to a station 301 and supported by transmission towers 310-312. Each transmission line may be installed with a potential transformer for measuring phase voltages. In the illustrated example, the transmission line 309 experiences a line-to-ground fault. The PT 303 installed on the transmission line 309 measures voltage of the transmission line 309. The PT 303 is coupled to the ground grid 305. Further, a PT 304 is installed to measure the potential between the ground grid 305 and the remote earth 306. In various embodiments, the PT 304 may be a 12 kV/120V transformer.

As illustrated, the GPR sensing PT 304 is installed such that one side is coupled to the substation ground grid and the other side is connected to an insulated wire 320. The insulated wire 320 is insulated from any structures and extend to a distance whereas the electrical zone of influence no longer exists from nearby structures. In various embodiments, this distance may be hundreds to thousands of feet. This insulated wire 320 should be coupled to a ground rod 321 located far away from the substation and made of electrical conductive metals such as copper. The ground rod 321 is driven into the earth at a certain depth (for example, at least 15 to 20 feet). The insulated wire 320 may be of any size. In some embodiments, the insulated wire 320 may be coupled to multiple ground rods that are bonded together.

Figure 3B:
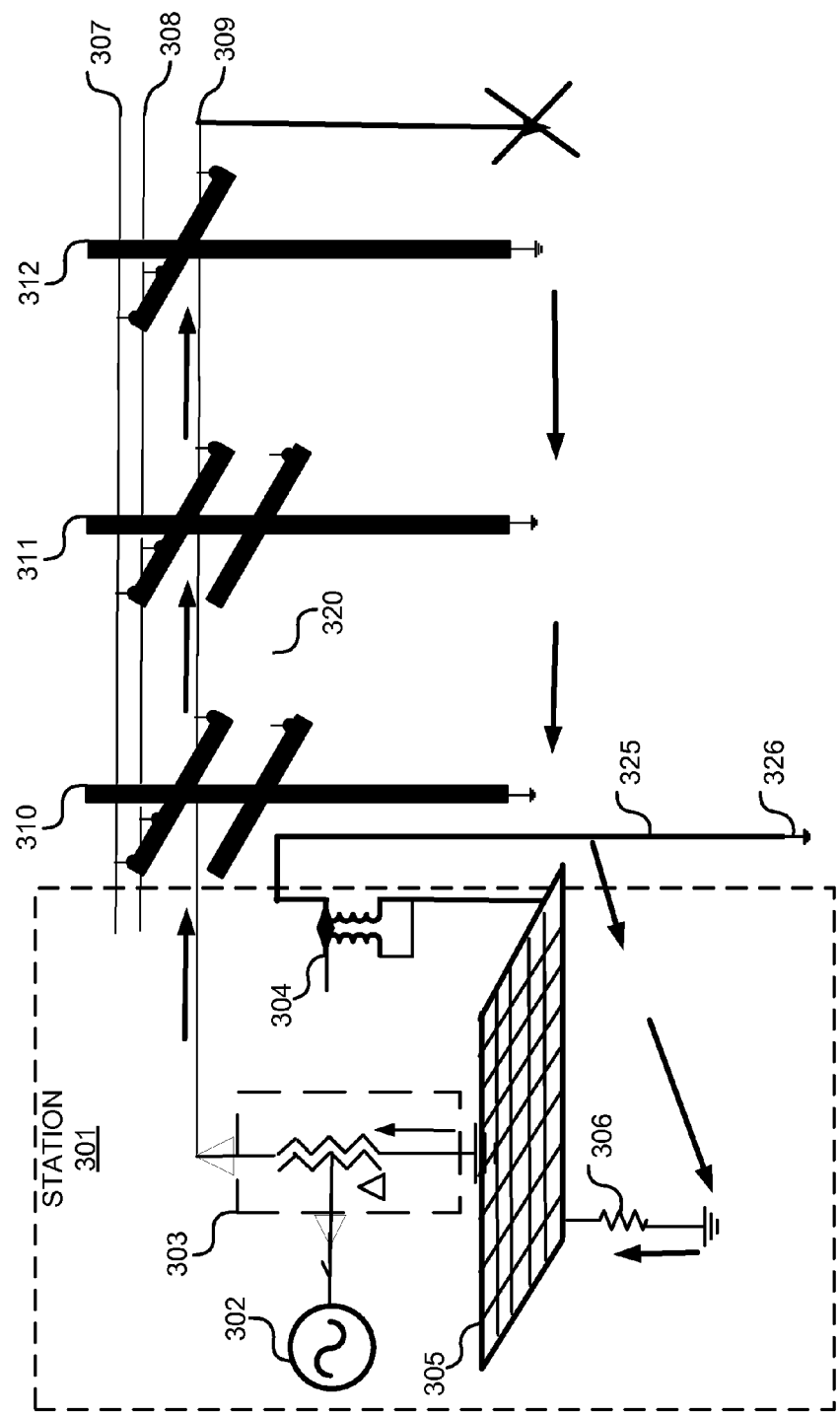
FIG. 3B illustrates an installation of an exemplary adaptive distance protection system in accordance with an embodiment.

FIG. 3B illustrates an installation of an exemplary adaptive distance protection system in accordance with an embodiment. Similar to the installation illustrated in FIG. 3A, one side of the GPR sensing PT 304 is coupled to the substation ground grid. The other side of the GPR sensing PT 304 is coupled to an insulated wire 325. The insulated wire 325 is buried underground to a distance from the substation where no electrical zone of influence exists and connected at this location to a ground rod 326 driven down into the earth.

Figure 3C:
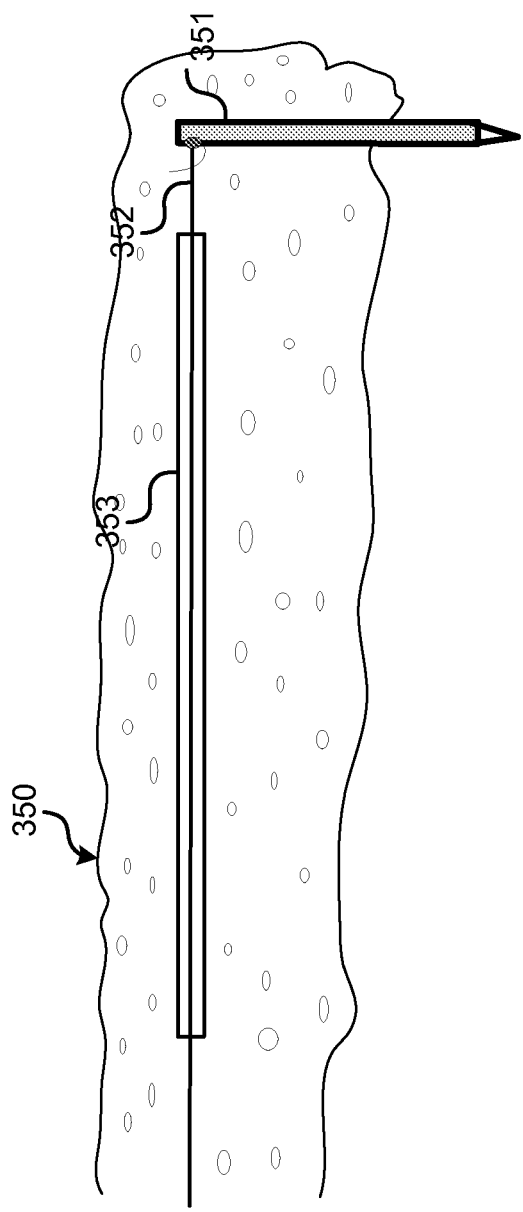
FIG. 3C illustrates an exemplary installation of an insulated wire to a remote location in accordance with an embodiment.

FIG. 3C illustrates an exemplary installation of an insulated wire 352 to a remote location in accordance with an embodiment. The remote location is coupled to a ground rod 351, which is used as a remote earth zero voltage reference. As illustrated, the ground rod 351 is installed below the ground surface 350. In various embodiments, the ground rod 351 is at least 10 to 20 feet long. The ground rod 351 may be made of materials such as steel or copper-clad steel. In various embodiments, the bonded wire 352 that is coupled to the ground rod 351 is at least 2 feet below the ground surface 350. One end of the wire 352 is coupled to the ground rod 351, and the other end of the wire 352 is coupled to a substation. The ground rod 351 is located at a remote location that is far away (e.g., at least 3-4 thousand feet) from the substation. In various embodiments, the wire 352 is an insulated wire (e.g., an insulated wire No. 4 with minimum 5-12 kV insulation). In one embodiment, the wire 352 may be surrounded by a pipe 353 of different sizes, such as a PVC pipe, schedule 80, 1.5-2".

Figure 3D:
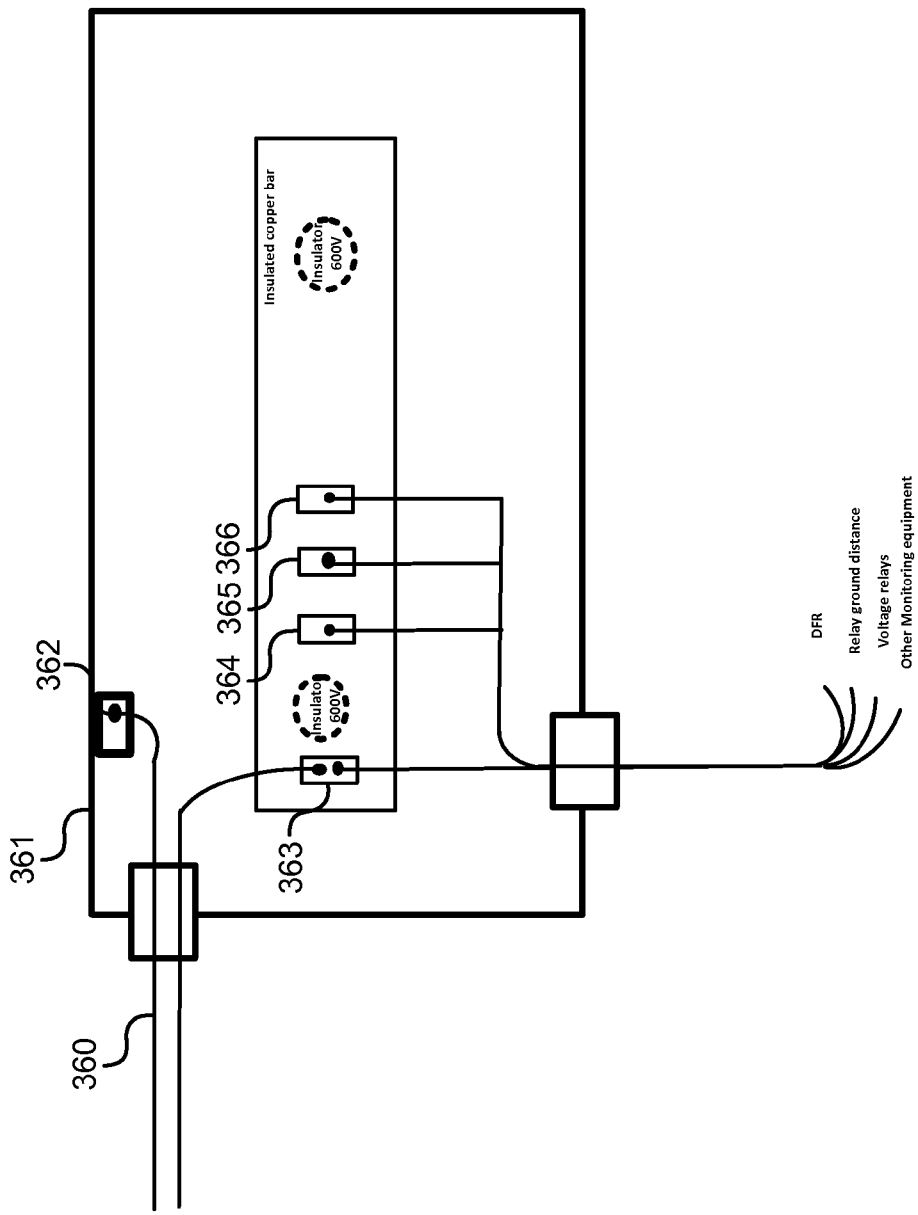
FIG. 3D illustrates an exemplary installation of a GPR sensor inside a control house in accordance with an embodiment.

In various embodiments, a surge arrester may be connected on the high voltage side of a GPR sensor (e.g., a GPR sensing PT.) The surge arrester may protect against any high voltage spikes coming from the remote earth wire, protecting the GPR sensor from possible insulation damage. The low voltage side of the GPR sensor may be connected to protective relay's Digital Fault Recording (DFR) and could also alarm for such conditions. FIG. 3D illustrates an exemplary installation of a GPR sensor inside a control house in accordance with an embodiment. A GPR sensor may be coupled to an electrical steel box 361 via a wire 360 to the ground connection 362. The DFR inside the control room is also coupled via connection 363 to the substation where the GPR sensor is installed. Various monitoring equipment may be coupled to the control house. For example, as illustrated, the connection 364 is coupled to a voltage relay, the connection 365 is coupled to a relay ground distance, and the connection 366 is coupled to other monitoring equipment.

Figure 4:
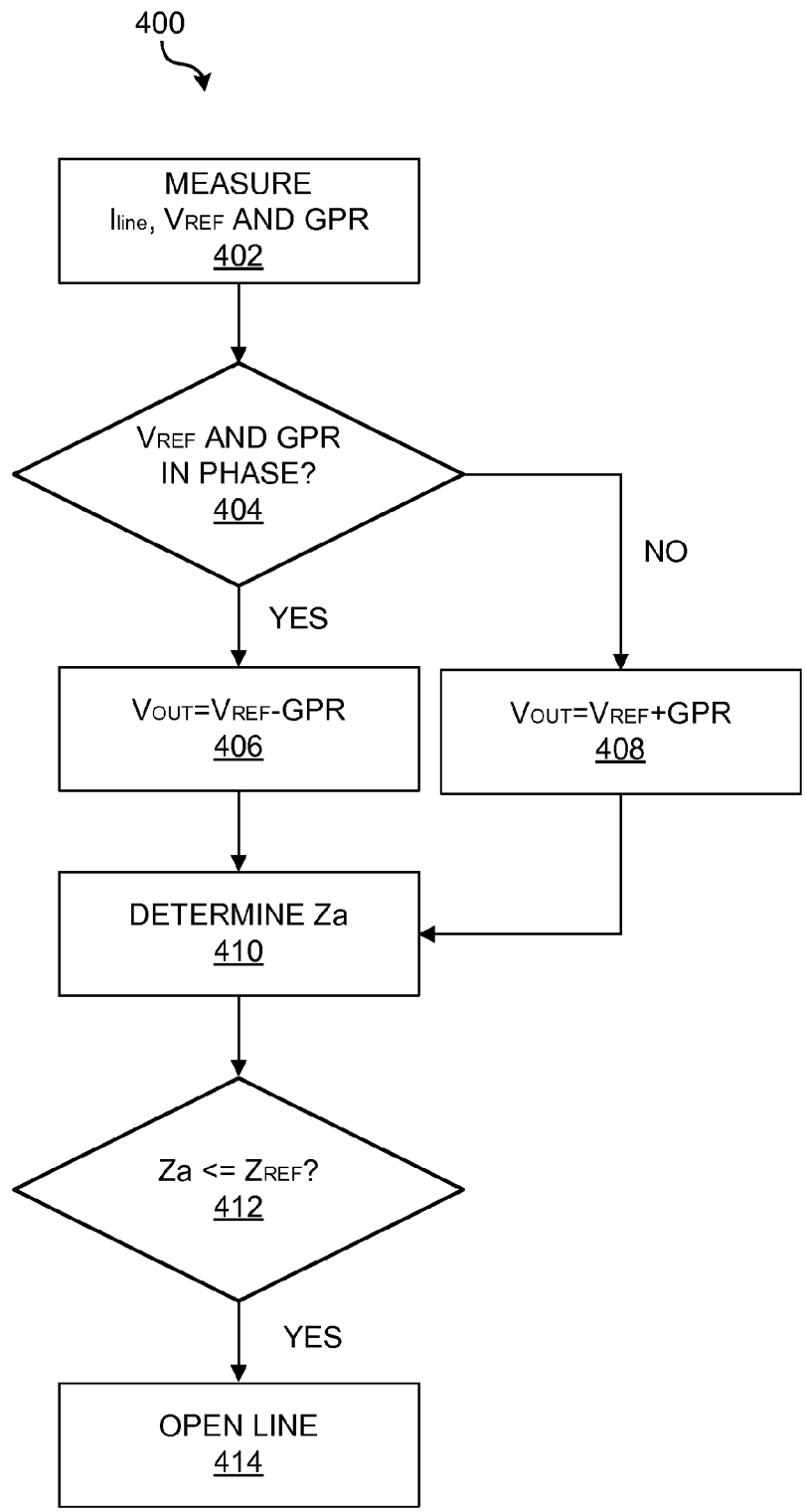
FIG. 4 is a flow chart illustrating an exemplary method of adaptive distance protection in accordance with an embodiment.

FIG. 4 is a flow chart illustrating an exemplary method 400 of adaptive distance protection in accordance with an embodiment. At step 402, a line current, a phase voltage $V_{REF}$ with reference to the grid ground, and GPR are measured with reference to the remote earth. At step 404, GPR and $V_{REF}$ are compared, in particular, phase angles of GPR and $V_{REF}$ are compared to determine whether GPR is in phase or out of phase with $V_{REF}$. At step 406, upon determining that GPR is in phase with $V_{REF}$, the output voltage for calculating the apparent impedance is determined as $V_{REF}$–GPR. At step 408, upon determining that GPR is out of phase with $V_{REF}$, the output voltage for calculating the apparent impedance is determined as $V_{REF}$+GPR.

At step 410, the apparent impedance of the transmission line is calculated based on the line current and the output voltage. In various embodiments, the apparent impedance of the transmission line is calculated according to Equation (2). At step 412, the calculated apparent impedance of the transmission line is compared to the reference impedance. The reference impedance may be a percentage of the line impedance of the transmission line. In one embodiment, the reference impedance value is between 80% and 90% of the line impedance. At step 414, the transmission line is tripped open when the calculated apparent impedance is determined to be equal to or less than the reference impedance value. In one embodiment, an instruction signal is generated and transmitted to open a circuit breaker in response to a determination that the calculated apparent impedance is equal to or less than the reference impedance.

As used herein, the terms less than, less than or equal to, greater than, and greater than or equal to, may be used herein to describe the relations between various objects or members of ordered sets or sequences; these terms will be understood to refer to any appropriate ordering relation applicable to the objects being ordered.

Figure 5:
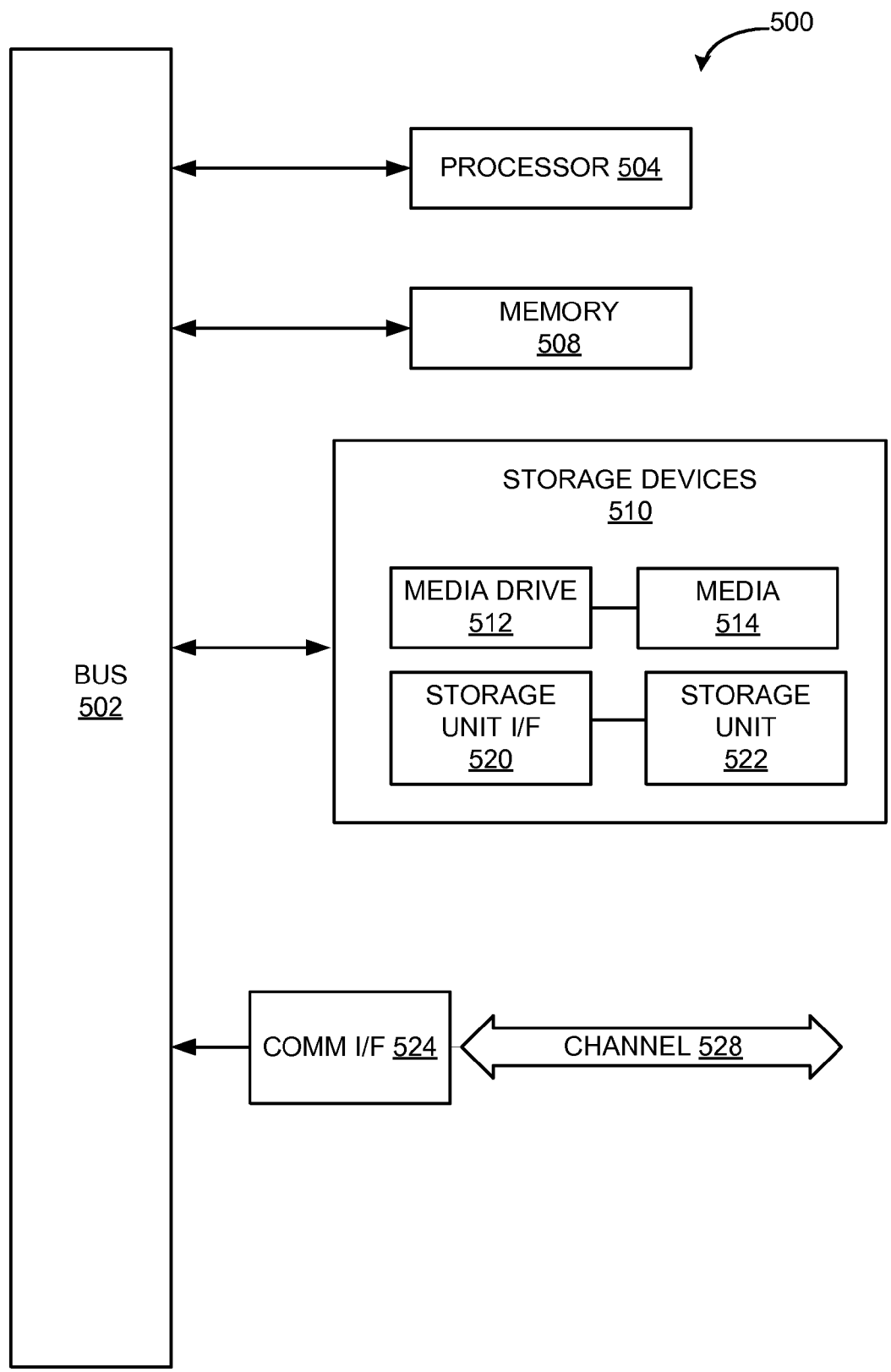
FIG. 5 illustrates an example computing module that may be used in implementing various features of embodiments of the invention.

As used herein, the term module might describe a given unit of functionality that can be performed in accordance with one or more embodiments of the present invention. As used herein, a module might be implemented utilizing any form of hardware, software, or a combination thereof. For example, one or more processors, controllers, ASICs, PLAs, PALs, CPLDs, FPGAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of the invention are implemented in whole or in part using software, in one embodiment, these software elements can be implemented to operate with a computing or processing module capable of carrying out the functionality described with respect thereto. One such example computing module is shown in FIG. 5. Various embodiments are described in terms of this example—computing module 500. After reading this description, it will become apparent to a person skilled in the relevant art how to implement the invention using other computing modules or architectures.

Referring now to FIG. 5, computing module 500 may represent, for example, computing or processing capabilities found within desktop, laptop and notebook computers; hand-held computing devices (PDA's, smart phones, cell phones, palmtops, etc.); mainframes, supercomputers, workstations or servers; or any other type of special-purpose or general-purpose computing devices as may be desirable or appropriate for a given application or environment. Computing module 500 might also represent computing capabilities embedded within or otherwise available to a given device. For example, a computing module might be found in other electronic devices such as, for example, digital cameras, navigation systems, cellular telephones, portable computing devices, modems, routers, WAPs, terminals and other electronic devices that might include some form of processing capability.

Computing module 500 might include, for example, one or more processors, controllers, control modules, or other processing devices, such as a processor 504. Processor 504 might be implemented using a general-purpose or special-purpose processing engine such as, for example, a microprocessor, controller, or other control logic. In the illustrated example, processor 504 is connected to a bus 502, although any communication medium can be used to facilitate interaction with other components of computing module 500 or to communicate externally.

Computing module 500 might also include one or more memory modules, simply referred to herein as main memory 508. For example, preferably random access memory (RAM) or other dynamic memory, might be used for storing information and instructions to be executed by processor 504. Main memory 508 might also be used for storing temporary variables or other intermediate information during execution of instructions to be executed by processor 504. Computing module 500 might likewise include a read only memory ("ROM") or other static storage device coupled to bus 502 for storing static information and instructions for processor 504.

The computing module 500 might also include one or more various forms of information storage mechanism 510, which might include, for example, a media drive 512 and a storage unit interface 520. The media drive 512 might include a drive or other mechanism to support fixed or removable storage media 514. For example, a hard disk drive, a floppy disk drive, a magnetic tape drive, an optical disk drive, a CD or DVD drive (R or RW), or other removable or fixed media drive might be provided. Accordingly, storage media 514 might include, for example, a hard disk, a floppy disk, magnetic tape, cartridge, optical disk, a CD or DVD, or other fixed or removable medium that is read by, written to or accessed by media drive 512. As these examples illustrate, the storage media 514 can include a computer usable storage medium having stored therein computer software or data.

In alternative embodiments, information storage mechanism 510 might include other similar instrumentalities for allowing computer programs or other instructions or data to be loaded into computing module 500. Such instrumentalities might include, for example, a fixed or removable storage unit 522 and an interface 520. Examples of such storage units 522 and interfaces 520 can include a program cartridge and cartridge interface, a removable memory (for example, a flash memory or other removable memory module) and memory slot, a PCMCIA slot and card, and other fixed or removable storage units 522 and interfaces 520 that allow software and data to be transferred from the storage unit 522 to computing module 500.

Computing module 500 might also include a communications interface 524. Communications interface 524 might be used to allow software and data to be transferred between computing module 500 and external devices. Examples of communications interface 524 might include a modem or softmodem, a network interface (such as an Ethernet, network interface card, WiMedia, IEEE 802.XX or other interface), a communications port (such as for example, a USB port, IR port, RS232 port Bluetooth® interface, or other port), or other communications interface. Software and data transferred via communications interface 524 might typically be carried on signals, which can be electronic, electromagnetic (which includes optical) or other signals capable of being exchanged by a given communications interface 524. These signals might be provided to communications interface 524 via a channel 528. This channel 528 might carry signals and might be implemented using a wired or wireless communication medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to media such as, for example, memory 508, storage unit 520, media 514, and channel 528. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 500 to perform features or functions of the present invention as discussed herein.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A ground potential rise sensor configured to measure ground potential rise of a substation, comprising:
    a first potential transformer, a first side of the first potential transformer coupled to the substation ground grid;
    a second potential transformer, a first side of the second potential transformer coupled to the substation ground grid;
    a first potential transformer, a second side of the first potential transformer coupled to a first end of a first wire;
    a second potential transformer, a second side of the second potential transformer coupled to a first end of a second wire;
    the first wire, the second end of the first wire coupled to a first ground rod;
    the second wire, the second end of the second wire coupled to a second ground rod;
    wherein the first potential transformer measures a first voltage and the second potential transformer measures a second voltage, further comprising determining the ground potential rise to be the first voltage; and
    wherein a proper voltage for calculating an apparent impedance is obtained by comparing a phase of the ground potential rise to a phase of the second voltage.

2. The ground potential rise sensor of claim 1, wherein the first wire is insulated.

3. The ground potential rise sensor of claim 1, further comprising the first ground rod, the first ground rod driven into the earth.

4. The ground potential rise sensor of claim 3, wherein the second end of the first wire and the first ground rod are free from an electrical zone of influence.

5. The ground potential rise sensor of claim 1, further comprising a surge arrester coupled to the first side of the first potential transformer.

6. The ground potential rise sensor of claim 1, wherein the second side of the first potential transformer is further coupled to a digital fault recorder.

7. The ground potential rise sensor of claim 1, wherein the second end of the first wire is further coupled to a third ground rod, the first ground rod and the third ground rod bonded together.

8. A method of installing a ground potential rise sensor configured to measure ground potential rise of a substation, comprising:
    coupling a first side of a first potential transformer to the substation ground grid;
    coupling a first side of a second potential transformer to the substation ground grid;
    coupling a second side of the first potential transformer to a first end of a first wire;
    coupling a second side of the second potential transformer to a first end of a second wire;
    coupling a second end of the first wire to a first ground rod;
    coupling a second end of the second wire to a second ground rod;
    obtaining a first voltage measured by the first potential transformer;
    obtaining a second voltage measured by the second potential transformer;
    determining the ground potential rise to be the first voltage; and
    obtaining a proper voltage for calculating an apparent impedance by comparing a phase of the ground potential rise to a phase of the second voltage.

9. The method of claim 8, wherein the first wire is insulated.

10. The method of claim 8, further comprising driving the first ground rod into the earth.

11. The method of claim 9, wherein the second end of the first wire and the first ground rod are free from an electrical zone of influence.

12. The method of claim 8, further comprising coupling a surge arrester to the first side of the first potential transformer.

13. The method of claim 8, further comprising coupling a digital fault recorder to a second side of the first potential transformer.

14. The method of claim 8, wherein the second end of first the wire is further coupled to a third ground rod, the first ground rod and the third ground rod bonded together.

* * * * *